United States Patent
Wagner et al.

(10) Patent No.: US 11,814,300 B2
(45) Date of Patent: Nov. 14, 2023

(54) TETRAKIS(TRICHLOROSILYL)GERMANE, PROCESS FOR THE PREPARATION THEREOF AND USE THEREOF

(71) Applicant: Evonik Operations GmbH, Essen (DE)

(72) Inventors: Matthias Wagner, Maintal/Doernigheim (DE); Julian Teichmann, Frankfurt am Main (DE); Hans-Wolfram Lerner, Oberursel (DE)

(73) Assignee: Evonik Operations GmbH, Essen (DE)

( * ) Notice: Subject to any disclaimer, the term of this patent is extended or adjusted under 35 U.S.C. 154(b) by 335 days.

(21) Appl. No.: 17/309,254

(22) PCT Filed: Nov. 7, 2019

(86) PCT No.: PCT/EP2019/080598
§ 371 (c)(1),
(2) Date: May 12, 2021

(87) PCT Pub. No.: WO2020/099242
PCT Pub. Date: May 22, 2020

(65) Prior Publication Data
US 2022/0048777 A1 Feb. 17, 2022

(30) Foreign Application Priority Data

Nov. 14, 2018 (EP) .................................. 18206150

(51) Int. Cl.
*C01G 17/00* (2006.01)
*C01B 33/06* (2006.01)
(Continued)

(52) U.S. Cl.
CPC ............ *C01G 17/006* (2013.01); *C01B 33/06* (2013.01); *C01B 33/08* (2013.01); *C23C 16/22* (2013.01);
(Continued)

(58) Field of Classification Search
CPC ....... C01G 17/006; C01B 33/06; C01B 33/08; C01B 33/107; C23C 16/22; C01P 2002/77; C01P 2002/86
See application file for complete search history.

(56) References Cited

U.S. PATENT DOCUMENTS 7,758,697 B2 * 7/2010 Comita .................. C01B 33/04
117/91
10,414,783 B2 9/2019 Teichmann et al.
(Continued)

FOREIGN PATENT DOCUMENTS

| WO | 2004/036631 | 4/2004 |
| WO | 2020/099233 | 5/2020 |

OTHER PUBLICATIONS

Joiner Systematic Preparation of Chloropolysilanes and Chlorosilylgermanes 1973 (Year: 1973).*
(Continued)

*Primary Examiner* — Anthony J Zimmer
*Assistant Examiner* — Jordan W Taylor
(74) *Attorney, Agent, or Firm* — Grüneberg and Myers, PLLC

(57) ABSTRACT

A novel process provides for the preparation of the chlorinated, uncharged substance tetrakis(trichlorosilyl)germane, and for the use thereof.

16 Claims, 2 Drawing Sheets

Crystal structure of Ge(SiCl₃)₄ (f).

(51) Int. Cl.
  *C01B 33/08* (2006.01)
  *C23C 16/22* (2006.01)
(52) U.S. Cl.
  CPC ...... *C01P 2002/77* (2013.01); *C01P 2002/86* (2013.01)

(56) References Cited

U.S. PATENT DOCUMENTS

| | | | |
|---|---|---|---|
| 10,618,921 | B2 | 4/2020 | Teichmann et al. |
| 10,730,754 | B2 | 8/2020 | Teichmann et al. |
| 2018/0346494 | A1 | 12/2018 | Teichmann et al. |
| 2018/0346495 | A1 | 12/2018 | Teichmann et al. |
| 2020/0165278 | A1 | 5/2020 | Teichmann et al. |
| 2020/0180966 | A1 | 6/2020 | Teichmann et al. |

OTHER PUBLICATIONS

International Search Report dated Feb. 12, 2020 in PCT/EP2019/080598 with translation, 8 pages.
Written Opinion dated Feb. 12, 2020 in PCT/EP2019/080598 with translation, 9 pages.
Fehér et al., "*Beiträge Zur Chemie Des Siliziums Und Germaniums XIV$^1$*", Tetrahedron Letters No. 51, Pergamon Press, 1970, pp. 4443-4447.
James Ray Joiner, Jr., "*Systematic Preparation of Chloropolysilanes and Chlorosilylgermanes*", University Microfilms, Sep. 1972, 70 pages.
Lobreyer et al., "*Synthese und Struktur von Tetrasilylgerman, $Ge(SiH_3)_4$, und weiteren Silylgermanen*", Angew. Chem., vol. 105, 1993, pp. 587-588.
Müller et al., "*Trichlorosilylation of chlorogermanes and chlorostannanes with $HSiCl_3/Net_3$ followed by base-catalysed formation of $(Me_3Ge)_2Si(SiCl_3)_2$ and related branched stannylsilanes*", Journal of Orga nometallic Chemistry, vol. 579, 1999, pp. 156-163.
Ritter et al., "*Synthesis and Fundamental Studies of $(H_3Ge)_xSiH_{4-x}$ Molecules: Precursors to Semiconductor Hetero-and Nanostructures on Si*", Journal of the American Chemical Society, vol. 127, 2005, pp. 9855-9864.
Teichmann et al., "*Tris(trichlorosilyl)tetrelide Anions and a Comparative Study of Their Donor Qualities*", Chemistry—A European Journal, 2019, pp. 2740-2744.
U.S. Pat. No. 10,414,783, Sep. 17, 2019, 2018/0346494, Teichmann at al.
U.S. Pat. No. 10,730,754, Aug. 4, 2020, 2020/0180966, Teichmann et al.
U.S. Pat. No. 10,618,921, Apr. 14, 2020, 2018/0346495, Teichmann et al.
U.S. Appl. No. 16/774,682, filed Jan. 28, 2020, 2020/0165278, Teichmann et al.

* cited by examiner

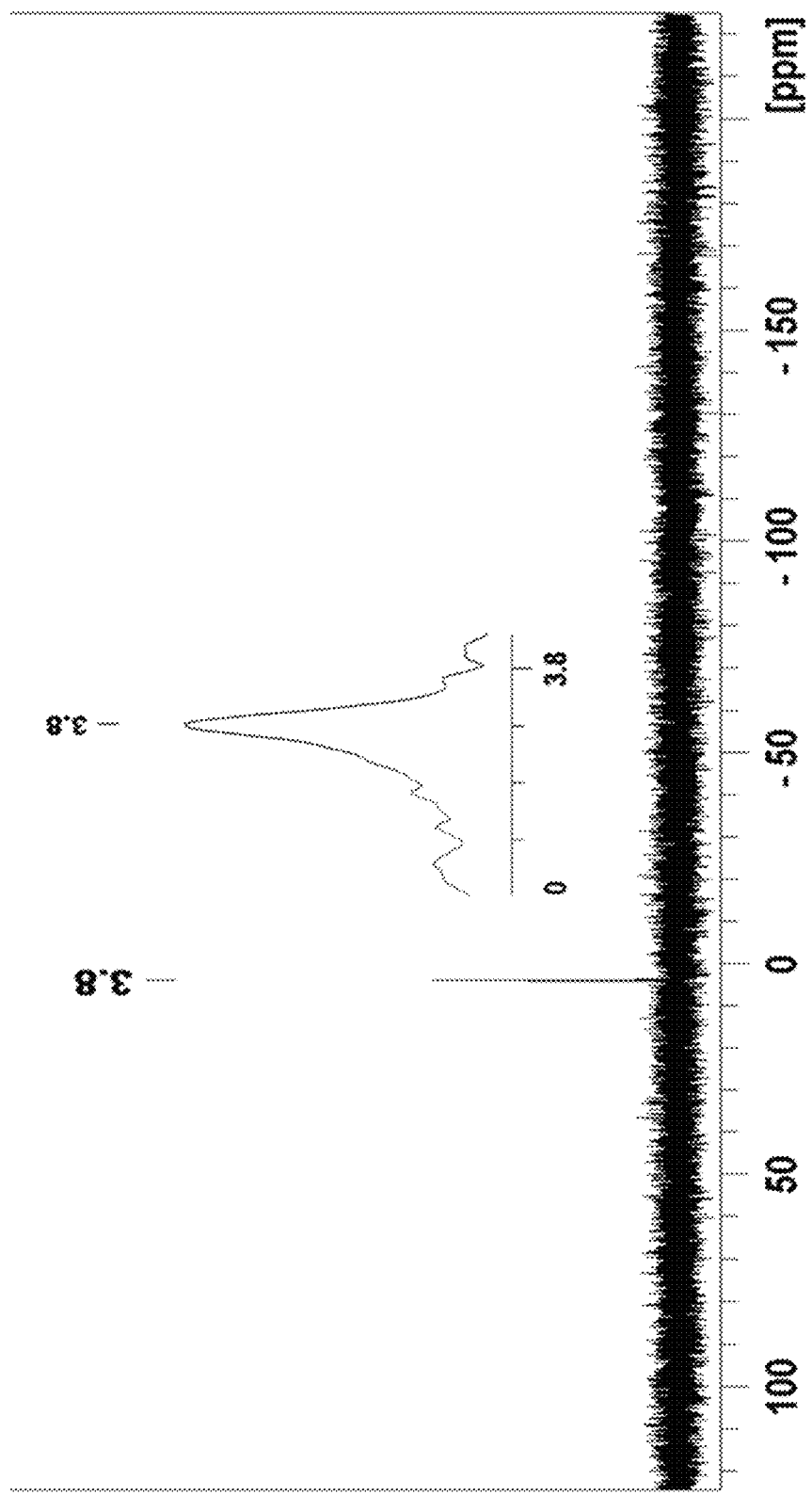

Crystal structure of Ge(SiCl₃)₄ (I).

TETRAKIS(TRICHLOROSILYL)GERMANE, PROCESS FOR THE PREPARATION THEREOF AND USE THEREOF

CROSS-REFERENCE TO RELATED APPLICATIONS

This application is the National Stage entry under § 371 of International Application No. PCT/EP2019/080598, filed on Nov. 7, 2019, and which claims the benefit of European Application No. 18206150.7, filed on Nov. 14, 2018. The content of each of these applications is hereby incorporated by reference in its entirety.

BACKGROUND OF THE INVENTION

Field of the Invention

The present invention relates to the novel process for the preparation of the chlorinated, uncharged substance tetrakis(trichlorosilyl)germane, and to the use thereof.

Description of Related Art

Halosilanes, polyhalosilanes, halogermanes, polyhalogermanes, silane, polysilanes, germane, polygermanes and corresponding mixed compounds have long been known, cf., in addition to the customary textbooks of inorganic chemistry, also WO 2004/036631 A2 or C. J. Ritter et al., J. Am. Chem. Soc., 2006, 127, 9855-9884.

Lars Müller et al. in J. Organomet. Chem. 1999, 579, 158-163, describe a method for producing Si—Ge bonds by reacting partially chlorinated organic germanium compounds with trichlorosilane while adding triethylamine.

Thomas Lobreyer et al. propose a further possibility for producing neutral Si—Ge compounds by means of the reaction of $SiH_4$ and $GeH_4$ with sodium (Angew. Chem. 1993, 105, 587-588).

In WO 2004/036631 A2, Singh et al. propose various Si—Ge compounds for the deposition of Si films or films comprising Si.

Patent applications EP 17173940.2, EP 17173951.9 and EP 17173959.2 disclose further Si—Ge compounds and processes for the preparation thereof.

SUMMARY OF THE INVENTION

Thus, for the purposes of fundamental research, the aim is to find novel compounds or at the least novel preparation mutes for such compounds, in particular also with respect to potential industrial and optionally improvable applications.

The present invention is based on the object of providing a novel synthesis possibility for preparing an uncharged silicon-germanium compound without using pyrophoric or toxic substances.

A completely novel synthesis possibility was round in the reaction of ammonium or phosphonium tris(trichlorosilyl)germanide salts of the $[R_4N][Ge(SiCl_3)_3]$ or $[R_4P][Ge(SiCl_3)_3]$ type with $AlCl_3$ and alkylic or aromatic radicals R, which results in an uncharged, chlorinated Si—Ge compound. What is surprising with this novel synthesis is that, inter alia, the resulting tetrakis(trichlorosilyl)germane is produced in one step and is uncharged.

The invention accordingly provides the process for preparing tetrakis(trichlorosilyl)germane of the formula (I).

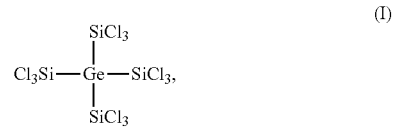

(I)

by
(a) mixing at least one tris(trichlorosilyl)germanide salt of the $[X][Ge(SiCl_3)_3]$ type where
X=ammonium ($R_4N$) and/or phosphonium ($R_4P$),
R=alkylic or aromatic radical,
with $AlCl_3$, and
(b) reacting same in an environment consisting at least of one chlorinated hydrocarbon at a temperature of 5 to 40° C. to obtain a crude product comprising salts $[R_4N][AlCl_4]$ and/or $[R_4P][AlCl_4]$ and tetrakis(trichlorosilyl)germane, and subsequently
(c) introducing said crude product into at least one nonpolar solvent and separating off the insoluble residue, and subsequently
(d) removing the nonpolar solvent, to obtain tetrakis(trichlorosilyl)germane.

The process has the advantage that neither pyrophoric nor toxic substances such as, for example, $SiH_4$, $GeH_4$ or sodium need to be used. It is true that processes are already known in the prior art that avoid the use of such hazardous substances. However, these conventional processes generally yield neutral Si—Ge compounds with organic radicals. Organic radicals prevent the use of the Si—Ge compounds in those deposition reactions that are of interest for semiconductor electronics, because SiC is formed at the temperatures that are set during the deposition. SiC is nonconductive and destroys the desired conductive or semiconductive property of Si—Ge layers.

Nor can salt-type Si—Ge compounds be used in semiconductor electronics, since organic radicals are present in such substances.

In contrast, in the process according to the invention neither a salt-type Si—Ge compound is produced, nor are organic radicals present. Instead, in the process according to certain embodiments disclosed herein, a salt-type starting material is converted into an uncharged, nonionic product in a single step. An additional, immensely important advantage that emerges is thus that the tetrakis(trichlorosilyl)germane according to the invention or obtained according to the invention can be used without problems in semiconductor electronics.

The invention thus likewise provides for the use of the tetrakis(trichlorosilyl)germane prepared by the process according to the invention
as precursor for the deposition of Si—Ge layers.
The invention is explained in more detail hereafter.

BRIEF DESCRIPTION OF THE DRAWINGS

FIG. 1A shows the $^{29}Si$ NMR spectrum of the product I.

DETAILED DESCRIPTION OF THE INVENTION

Figure 1B:
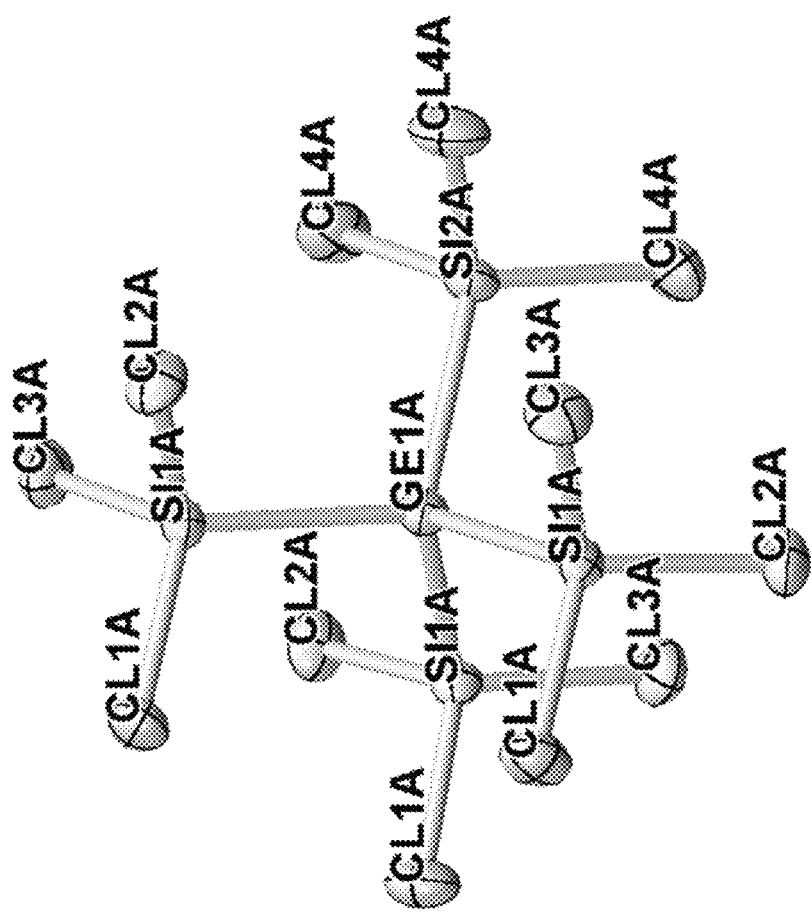
FIG. 1B shows the result of the analysis of the product I by X-ray diffractometry.

In the context of the invention, the term "standard pressure" is synonymous with the term "ambient pressure". This is understood to mean the pressure of the surrounding gas of 1013 hPa. In the context of the invention, the term "room temperature" is abbreviated to "RT".

At least one, two, three or all of the steps of the process according to the invention can preferably be conducted under standard pressure and/or in an oxygen-free, dry environment.

In the reaction in step b of the process according to the invention, a crude product is obtained that comprises, in addition to the salts [R$_4$N][AlCl$_4$] and/or [R$_4$P][AlCl$_4$], the chlorinated uncharged compound tetrakis(trichlorosilyl)germane.

The ammonium or phosphonium chloride salts form salts with AlCl$_3$ of the [R$_4$N][AlCl$_4$] or [R$_4$P][AlCl$_4$] type that are likewise present in the crude product. The uncharged molecule of the formula (I) is separated off from these salt-type compounds by extraction with nonpolar solvents and obtained in pure form. Suitable nonpolar solvents are advantageously pentane, hexane and/or benzene. Particularly preferably, n-hexane can be used.

It may be advantageous, in step b of the process according to the invention, to conduct the reaction at room temperature, and/or in step d to remove the nonpolar solvent at room temperature.

Additionally, in step b of the process according to the invention, the chlorinated hydrocarbon used may be dichloromethane CH$_2$Cl$_2$.

In step c of the process according to the invention, the nonpolar solvent can preferably be selected from hexane, n-hexane, pentane and/or benzene. Particularly preferably, n-hexane can be used in step c.

A further-preferred embodiment of the process according to the invention consists, in step a, in [X][Ge(SiCl$_3$)$_3$] and AlCl$_3$, these components preferably being in the solid state, being mixed by means of stirring, preferably in an oxygen-free environment, particularly preferably under protective gas, nitrogen or argon, additionally preferably in a glovebox, and, in step b, the mixture obtained in step a is dissolved completely in the chlorinated hydrocarbon(s), and, after a time of 0.1 to 24 hours, preferably after 1 to 5 hours, the chlorinated hydrocarbon(s) are removed, preferably at a temperature of 5 to 40° C. particularly preferably at room temperature, additionally preferably in an oxygen-free, dry environment, particularly preferably in an isolated environment, additionally preferably under standard pressure or reduced pressure, particularly preferably in the range from 1 to 500 hPa.

It may additionally be advantageous when, in step c of the process, after the introduction of the crude product, the temperature of the nonpolar solvent(s) is brought for from 1 to 5 times, preferably 3 times, from RT to elevated temperature. The temperature of the nonpolar solvent(s) can preferably be brought to the boiling point at least of one nonpolar solvent, and subsequently the nonpolar solvent(s) can be allowed to cool, preferably to RT.

It has furthermore been found that tetrakis(trichlorosilyl) germane can be reacted with 6 equivalents of LiAlH$_4$ in the solvent Et$_2$O to give the neutral hydrogenated compound tetrakis(silyl)germane. This reaction can preferably be conducted in a glovebox. It is additionally preferable to conduct the reaction at room temperature and under ambient pressure.

The hydrogenated compound tetrakis(silyl)germane has indeed already been described by Thomas Lobreyer et al. (Angew. Chem. 1993, 105, 587-588). However, it was obtained in that document with the use of the pyrophoric and toxic starting materials SiH$_4$ and GeH$_4$.

The example which follows provides additional explanation of the present invention without restricting the subject-matter.

Example 1 describes the reaction of [Ph$_4$P][Ge(SiCl$_3$)$_3$] with AlCl$_3$. The reaction of other ammonium or phosphonium tris(trichlorosilyl)germanide salts of the [R$_4$N][Ge(SiCl$_3$)$_3$] or [R$_4$P][Ge(SiCl$_3$)$_3$] type can be conducted analogously.

Analytical Methods for Determination of the Crystal Structure

The data for all structures were collected at 173 K using a STOE IPDS II two-circle diffractometer with a Genix microfocus tube having mirror optics using MoK$_\alpha$ radiation ($\lambda$=0.71073 Å) and scaled using the frame scaling procedure of the X-AREA program (Sloe & Cie, 2002). The structures were solved by direct methods with the aid of the SHELXS program (Sheldrick, 2008) and refined on F$^2$ by the full matrix least squares technique. Cell parameters were determined by refinement on θ values of the reflections with I>6σ(I).

Example 1: Preparation of tetrakis(trichlorosilyl)germane (I)

The synthesis was effected in accordance with Equation 1 from [Ph$_4$P][Ge(SiCl$_3$)$_3$] with AlCl$_3$ while adding CH$_2$Cl$_2$.

Reaction of [Ph$_4$P][Ge(SiCl$_3$)$_3$] and AlCl$_3$ at room temperature while adding CH$_2$Cl$_2$.

Equation 1

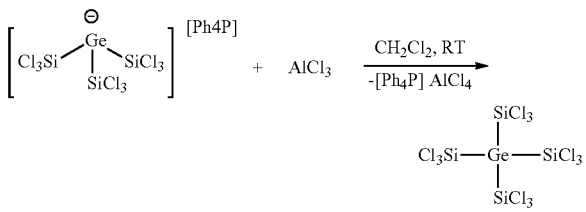

The reaction was conducted in a glovebox.

[Ph$_4$P][Ge(SiCl$_3$)$_3$] at an amount of 0.10 g, corresponding to 0.12 mmol, and AlCl$_3$ at an amount of 0.016 g, corresponding to 0.12 mmol, were mixed in the solid state and subsequently completely dissolved in dichloromethane CH$_2$Cl$_2$.

After 3 hours, the dichloromethane was slowly evaporated at RT and under standard pressure. After one day, a mixture of Ge(SiCl$_3$)$_4$ (I) and [Ph$_4$P][AlCl$_4$] had formed as crystalline crude product. The crude product was heated to boiling three times with in each case 7 ml of n-hexane.

Subsequently, the clear, colourless n-hexane solution was separated off from the insoluble residue with a syringe.

The nonpolar solvent was subsequently removed slowly at RT and under standard pressure, and after one day it was possible to isolate the inventive product Ge(SiCl$_3$)$_4$ (I) as a crystalline substance. The yield was 0.018 g, corresponding to 0.029 mmol or 24%.

The $^{29}$Si NMR spectrum of the inventive product I is presented in FIG. 1a, and the result of the analysis thereof by means of X-ray diffractometry is presented in FIG. 1b.

The data of the $^{29}$Si NMR spectroscopy analysis:
$^{29}$Si NMR (99.4 MHz, CD$_2$Cl$_2$, 298 K): δ=3.8 ppm.

The invention claimed is:

1. A process for preparing a tetrakis(trichlorosilyl)germane of the formula (I),

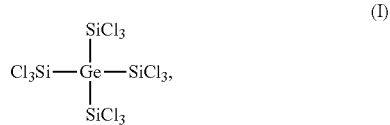

(I)

the process comprising:
(a) mixing at least one tris(trichlorosilyl)germanide salt of a formula [X][Ge(SiCl$_3$)$_3$], wherein
X=ammonium (R$_4$N) and/or phosphonium (R$_4$P), and wherein R=alkyl[[ic]]
radical or aromatic radical,
with AlCl$_3$, thereby obtaining a mixture, and
(b) reacting the mixture in an environment comprising at least one chlorinated hydrocarbon at a temperature of 5 to 40° C. to obtain a crude product comprising at least one salt [R$_4$N][AlCl$_4$] and/or [R$_4$P][AlCl$_4$] and tetrakis(trichlorosilyl)germane, and subsequently
(c) introducing said crude product into at least one nonpolar solvent and separating off an insoluble residue, and subsequently
(d) removing the nonpolar solvent, to obtain tetrakis(trichlorosilyl)germane.

2. The process according to claim 1, wherein in step (b) the reaction is conducted at room temperature, and/or in step (d) the nonpolar solvent is removed at room temperature.

3. The process according to claim 1, wherein, in step (b), the chlorinated hydrocarbon is dichloromethane (CH$_2$Cl$_2$).

4. The process according to claim 1, wherein in step (c), the at least one nonpolar solvent is selected from the group consisting of hexane, n-hexane, pentane, and benzene.

5. The process according to claim 1, wherein
in step (a),
the mixing of [X][Ge(SiCl$_3$)$_3$] and AlCl$_3$ comprises stirring, and
in step (b),
the mixture obtained in step (a) is dissolved completely in the at least one chlorinated hydrocarbon, and, after a time of 0.1 to 24 hours,
the at least one chlorinated hydrocarbon is removed.

6. The process according to claim 1, wherein
in step (c), after the introducing of the crude product, the temperature of the at least one nonpolar solvent is brought 1 to 5 times from room temperature to above room temperature, and subsequently the at least one nonpolar solvent is allowed to cool.

7. The process according to claim 1, further comprising:
depositing at least one Si—Ge layer with the tetrakis(trichlorosilyl)germane as precursor.

8. A Si—Ge layer deposition process, comprising:
depositing at least one Si—Ge layer with, as a precursor, a tetrakis(trichlorosilyl)germane obtained by the process according to claim 1.

9. The process according to claim 1, wherein in step (c), the at least one nonpolar solvent comprises n-hexane.

10. The process according to claim 1, wherein
in step (a),
the mixing of [X][Ge(SiCl$_3$)$_3$] and AlCl$_3$ comprises stirring [X][Ge(SiCl$_3$)$_3$] and AlCl$_3$ in a solid state, in an oxygen-free environment under nitrogen or argon in a glovebox, and
in step (b),
the mixture obtained in step (a) is dissolved completely in the at least one chlorinated hydrocarbon, and, after a time of 1 to 5 hours,
the at least one chlorinated hydrocarbon is removed at room temperature, in an oxygen-free, dry, environment, under standard pressure or under a reduced pressure of from 1 to 500 hPa.

11. The process according to claim 1, wherein
in step (c), after the introducing of the crude product, the temperature of the at least one nonpolar solvent is brought for 3 times from room temperature to the boiling point of the at least one nonpolar solvent, and subsequently the at least one nonpolar solvent is allowed to cool to room temperature.

12. The process according to claim 1, wherein the crude product obtained in step (b) is uncharged tetrakis(trichlorosilyl)germane.

13. The process according to claim 1, wherein the process is free of added SiH$_4$.

14. The process according to claim 1, wherein the process is free of added GeH$_4$.

15. The process according to claim 1, wherein the process is free of added sodium.

16. The process according to claim 1, wherein no organic radicals are present in the tetrakis(trichlorosilyl)germane.

* * * * *